(12) United States Patent
Kale et al.

(10) Patent No.: US 11,887,647 B2
(45) Date of Patent: Jan. 30, 2024

(54) DEEP LEARNING ACCELERATOR AND RANDOM ACCESS MEMORY WITH SEPARATE MEMORY ACCESS CONNECTIONS

(71) Applicant: Micron Technology, Inc., Boise, ID (US)

(72) Inventors: Poorna Kale, Folsom, CA (US); Jaime Cummins, Bainbridge Island, WA (US)

(73) Assignee: Micron Technology, Inc., Boise, ID (US)

( * ) Notice: Subject to any disclaimer, the term of this patent is extended or adjusted under 35 U.S.C. 154(b) by 446 days.

(21) Appl. No.: 16/844,993

(22) Filed: Apr. 9, 2020

(65) Prior Publication Data
US 2021/0319822 A1 Oct. 14, 2021

(51) Int. Cl.
*G06F 9/38* (2018.01)
*G11C 11/34* (2006.01)
(Continued)

(52) U.S. Cl.
CPC .......... *G11C 11/34* (2013.01); *G06F 9/30007* (2013.01); *G06F 9/3877* (2013.01);
(Continued)

(58) Field of Classification Search
CPC ... G11C 11/34; G11C 2207/2209; G11C 7/10; G11C 11/54; G06F 9/30007;
(Continued)

(56) References Cited

U.S. PATENT DOCUMENTS

| | | | |
|---|---|---|---|
| 5,815,456 A * | 9/1998 | Rao ........................ | G11C 7/10 365/230.09 |
| 7,873,812 B1 * | 1/2011 | Mimar ................ | G06F 9/30109 712/7 |

(Continued)

FOREIGN PATENT DOCUMENTS

| WO | 2005091203 | 9/2005 |
|---|---|---|
| WO | 2020058560 | 3/2020 |

OTHER PUBLICATIONS

Chen, et al. "A Design of High-Speed Image Acquisition Card Based on PCI Express." International Conference on Computer Application and System Modeling, ICCASM, IEEE, 2010.
(Continued)

*Primary Examiner* — Shawn Doman
(74) *Attorney, Agent, or Firm* — Greenberg Traurig

(57) ABSTRACT

Systems, devices, and methods related to a Deep Learning Accelerator and memory are described. An integrated circuit may be configured to execute instructions with matrix operands and configured with: random access memory configured to store instructions executable by the Deep Learning Accelerator and store matrices of an Artificial Neural Network; a connection between the random access memory and the Deep Learning Accelerator; a first interface to a memory controller of a Central Processing Unit; and a second interface to a direct memory access controller. While the Deep Learning Accelerator is using the random access memory to process current input to the Artificial Neural Network in generating current output from the Artificial Neural Network, the direct memory access controller may concurrently load next input into the random access memory; and at the same time, the Central Processing Unit may concurrently retrieve prior output from the random access memory.

19 Claims, 8 Drawing Sheets

(51) Int. Cl.
*G06F 9/30* (2018.01)
*G06N 3/063* (2023.01)
*G06F 9/50* (2006.01)
*G06N 3/10* (2006.01)
*G06F 17/16* (2006.01)

(52) U.S. Cl.
CPC .......... *G06F 9/3893* (2013.01); *G06F 9/5027* (2013.01); *G06F 17/16* (2013.01); *G06N 3/063* (2013.01); *G06N 3/10* (2013.01)

(58) Field of Classification Search
CPC .... G06F 9/3877; G06F 9/3893; G06F 9/5027; G06F 9/3001; G06F 9/30036; G06F 17/16; G06N 3/063; G06N 3/10; G06N 3/08
See application file for complete search history.

(56) References Cited

U.S. PATENT DOCUMENTS

| | | |
|---|---|---|
| 10,387,122 B1 | 8/2019 | Olsen |
| 10,515,135 B1 | 12/2019 | Zejda et al. |
| 10,678,479 B1 | 6/2020 | Diamant et al. |
| 10,754,764 B2 | 8/2020 | Lekivetz et al. |
| 10,885,314 B2 | 1/2021 | Liu |
| 10,978,382 B2 | 4/2021 | Lai et al. |
| 11,188,825 B2 | 11/2021 | Boybat Kara et al. |
| 11,204,747 B1 | 12/2021 | Zejda et al. |
| 11,355,175 B2 | 6/2022 | Kale et al. |
| 11,461,651 B2 | 10/2022 | Kale et al. |
| 11,539,763 B2 | 12/2022 | Oyman et al. |
| 11,544,548 B2 | 1/2023 | Bae |
| 11,625,587 B2 | 4/2023 | Gu |
| 2005/0047670 A1 | 3/2005 | Qian et al. |
| 2006/0230213 A1 | 10/2006 | Tousek et al. |
| 2010/0076915 A1 | 3/2010 | Ku et al. |
| 2011/0219150 A1 | 9/2011 | Piccirillo et al. |
| 2011/0307228 A1 | 12/2011 | Kasabov |
| 2012/0257742 A1 | 10/2012 | Ebeid et al. |
| 2014/0279746 A1 | 9/2014 | De Bruin et al. |
| 2015/0038806 A1 | 2/2015 | Kaleal, III et al. |
| 2017/0316312 A1 | 11/2017 | Goyal et al. |
| 2018/0307974 A1 | 10/2018 | Fang et al. |
| 2018/0307976 A1 | 10/2018 | Fang et al. |
| 2019/0027018 A1 | 1/2019 | Corpus et al. |
| 2019/0042411 A1 | 2/2019 | Muralimanohar et al. |
| 2019/0046039 A1 | 2/2019 | Ramesh et al. |
| 2019/0050733 A1 | 2/2019 | Bopardikar et al. |
| 2019/0121837 A1* | 4/2019 | Azizi .................... G06F 9/3001 |
| 2019/0171941 A1 | 6/2019 | Quach et al. |
| 2019/0180170 A1 | 6/2019 | Huang et al. |
| 2019/0196825 A1* | 6/2019 | Grocutt ................. G06F 9/3013 |
| 2019/0258306 A1 | 8/2019 | Croxford |
| 2019/0286972 A1 | 9/2019 | El Husseini et al. |
| 2019/0286973 A1 | 9/2019 | Kovvuri et al. |
| 2019/0303198 A1 | 10/2019 | Kim et al. |
| 2019/0318230 A1 | 10/2019 | Cho et al. |
| 2019/0370086 A1 | 12/2019 | Heilper et al. |
| 2019/0370631 A1 | 12/2019 | Fais et al. |
| 2019/0391811 A1 | 12/2019 | Garegrat et al. |
| 2020/0034145 A1 | 1/2020 | Bainville et al. |
| 2020/0117450 A1* | 4/2020 | Mansell .............. G06F 9/30189 |
| 2020/0117580 A1 | 4/2020 | Lekivetz et al. |
| 2020/0184001 A1 | 6/2020 | Gu et al. |
| 2020/0202527 A1 | 6/2020 | Choi et al. |
| 2020/0250545 A1 | 8/2020 | Verrilli et al. |
| 2020/0380361 A1 | 12/2020 | Tanach |
| 2021/0011846 A1 | 1/2021 | Venkatesh et al. |
| 2021/0012178 A1 | 1/2021 | Venkatesh et al. |
| 2021/0019591 A1 | 1/2021 | Venkatesh et al. |
| 2021/0049231 A1 | 2/2021 | Majnemer et al. |
| 2021/0150260 A1 | 5/2021 | Wang et al. |
| 2021/0150317 A1 | 5/2021 | Hou et al. |
| 2021/0192287 A1 | 6/2021 | Dwivedi et al. |
| 2021/0209451 A1 | 7/2021 | Gu |
| 2021/0255860 A1 | 8/2021 | Morrison et al. |
| 2021/0279629 A1 | 9/2021 | Nelson |
| 2021/0318871 A1 | 10/2021 | Kale et al. |
| 2021/0319305 A1 | 10/2021 | Kale et al. |
| 2021/0319821 A1 | 10/2021 | Kale et al. |
| 2021/0319823 A1 | 10/2021 | Kale et al. |
| 2021/0320967 A1 | 10/2021 | Kale et al. |
| 2021/0390076 A1 | 12/2021 | Fang et al. |
| 2022/0044043 A1 | 2/2022 | Zhu et al. |
| 2022/0067527 A1 | 3/2022 | Xu et al. |
| 2022/0254400 A1 | 8/2022 | Kale et al. |
| 2023/0004804 A1 | 1/2023 | Kale et al. |
| 2023/0068106 A1 | 3/2023 | Hu et al. |

OTHER PUBLICATIONS

Marin, et al. "Image Processing System for PC Through the Enhanced Parallel Port." Proceedings of the IEEE International Symposium on Industrial Electronics, IEEE, 2010.

Integrated Circuit Device with Deep Learning Accelerator and Random Access Memory, U.S. Appl. No. 16/844,988, filed Apr. 9, 2020, Poorna Kale et al.

Deep Learning Accelerator and Random Access Memory with a Camera Interface, U.S. Appl. No. 16/844,997, filed Apr. 9, 2020, Poorna Kale et al.

Deep Learning Accelerator and Random Access Memory with a Camera Interface, U.S. Appl. No. 17/729,830, filed Apr. 26, 2022, Poorna Kale et al.

System on a Chip with Deep Learning Accelerator and Random Access Memory, U.S. Appl. No. 16/845,002, filed Apr. 9, 2020, Poorna Kale et al.

Edge Server with Deep Learning Accelerator and Random Access Memory, U.S. Appl. No. 16/845,007, filed Apr. 9, 2020, Poorna Kale et al.

Patient Monitoring using Edge Servers having Deep Learning Accelerator and Random Access Memory, U.S. Appl. No. 16/845,010, filed Apr. 9, 2020, Poorna Kale et al.

International Search Report and Written Opinion, PCT/US2021/025017, dated Jul. 13, 2021.

International Search Report and Written Opinion, PCT/US2021/025018, dated Jul. 13, 2021.

International Search Report and Written Opinion, PCT/US2021/026008, dated Jul. 22, 2021.

International Search Report and Written Opinion, PCT/US2021/026007, dated Jul. 22, 2021.

International Search Report and Written Opinion, PCT/US2021/026005, dated Jul. 23, 2021.

International Search Report and Written Opinion, PCT/US2021/026243, dated Jul. 27, 2021.

* cited by examiner

DEEP LEARNING ACCELERATOR AND RANDOM ACCESS MEMORY WITH SEPARATE MEMORY ACCESS CONNECTIONS

FIELD OF THE TECHNOLOGY

At least some embodiments disclosed herein relate to integrated circuit devices in general and more particularly, but not limited to, integrated circuit devices having accelerators for Artificial Neural Networks (ANNs), such as ANNs configured through machine learning and/or deep learning.

BACKGROUND

An Artificial Neural Network (ANN) uses a network of neurons to process inputs to the network and to generate outputs from the network.

For example, each neuron in the network receives a set of inputs. Some of the inputs to a neuron may be the outputs of certain neurons in the network; and some of the inputs to a neuron may be the inputs provided to the neural network. The input/output relations among the neurons in the network represent the neuron connectivity in the network.

For example, each neuron can have a bias, an activation function, and a set of synaptic weights for its inputs respectively. The activation function may be in the form of a step function, a linear function, a log-sigmoid function, etc. Different neurons in the network may have different activation functions.

For example, each neuron can generate a weighted sum of its inputs and its bias and then produce an output that is the function of the weighted sum, computed using the activation function of the neuron.

The relations between the input(s) and the output(s) of an ANN in general are defined by an ANN model that includes the data representing the connectivity of the neurons in the network, as well as the bias, activation function, and synaptic weights of each neuron. Based on a given ANN model, a computing device can be configured to compute the output(s) of the network from a given set of inputs to the network.

For example, the inputs to an ANN network may be generated based on camera inputs; and the outputs from the ANN network may be the identification of an item, such as an event or an object.

In general, an ANN may be trained using a supervised method where the parameters in the ANN are adjusted to minimize or reduce the error between known outputs associated with or resulted from respective inputs and computed outputs generated via applying the inputs to the ANN. Examples of supervised learning/training methods include reinforcement learning and learning with error correction.

Alternatively, or in combination, an ANN may be trained using an unsupervised method where the exact outputs resulted from a given set of inputs is not known before the completion of the training. The ANN can be trained to classify an item into a plurality of categories, or data points into clusters.

Multiple training algorithms can be employed for a sophisticated machine learning/training paradigm.

Deep learning uses multiple layers of machine learning to progressively extract features from input data. For example, lower layers can be configured to identify edges in an image; and higher layers can be configured to identify, based on the edges detected using the lower layers, items captured in the image, such as faces, objects, events, etc. Deep learning can be implemented via Artificial Neural Networks (ANNs), such as deep neural networks, deep belief networks, recurrent neural networks, and/or convolutional neural networks.

Deep learning has been applied to many application fields, such as computer vision, speech/audio recognition, natural language processing, machine translation, bioinformatics, drug design, medical image processing, games, etc.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
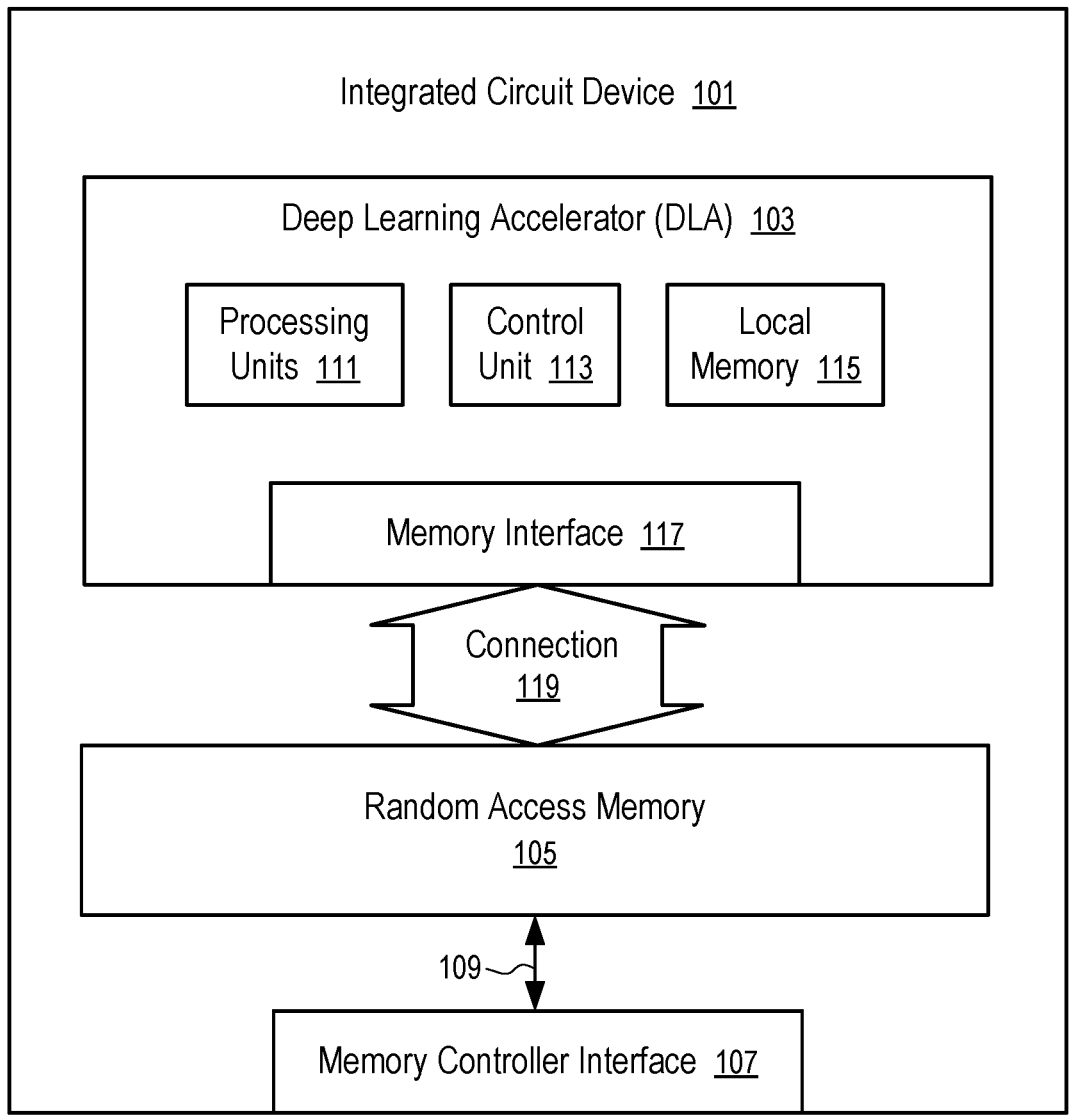
FIG. 1 shows an integrated circuit device having a Deep Learning Accelerator and random access memory configured according to one embodiment.

At least some embodiments disclosed herein provide a general-purpose integrated circuit device configured to perform computations of Artificial Neural Networks (ANNs) with reduced energy consumption and computation time. The integrated circuit device includes a Deep Learning Accelerator (DLA) and random access memory. The integrated circuit device can be configured with separate connections for concurrent access to the random access memory.

The Deep Learning Accelerator (DLA) includes a set of general-purpose, programmable hardware computing logic that is specialized and/or optimized to perform parallel vector and/or matrix calculations, including but not limited to multiplication and accumulation of vectors and/or matrices.

Further, the Deep Learning Accelerator (DLA) can include one or more Arithmetic-Logic Units (ALUs) to perform arithmetic and bitwise operations on integer binary numbers.

The Deep Learning Accelerator (DLA) is programmable via a set of instructions to perform the computations of an Artificial Neural Network (ANN).

The granularity of the Deep Learning Accelerator (DLA) operating on vectors and matrices corresponds to the largest unit of vectors/matrices that can be operated upon during the execution of one instruction by the Deep Learning Accelerator (DLA). During the execution of the instruction for a predefined operation on vector/matrix operands, elements of vector/matrix operands can be operated upon by the Deep Learning Accelerator (DLA) in parallel to reduce execution time and/or energy consumption associated with memory/data access. The operations on vector/matrix operands of the granularity of the Deep Learning Accelerator (DLA) can be used as building blocks to implement computations on vectors/matrices of larger sizes.

The implementation of a typical/practical Artificial Neural Network (ANN) involves vector/matrix operands having sizes that are larger than the operation granularity of the Deep Learning Accelerator (DLA). To implement such an Artificial Neural Network (ANN) using the Deep Learning Accelerator (DLA), computations involving the vector/matrix operands of large sizes can be broken down to the computations of vector/matrix operands of the granularity of the Deep Learning Accelerator (DLA). The Deep Learning Accelerator (DLA) can be programmed via instructions to carry out the computations involving large vector/matrix operands. For example, atomic computation capabilities of the Deep Learning Accelerator (DLA) in manipulating vectors and matrices of the granularity of the Deep Learning Accelerator (DLA) in response to instructions can be programmed to implement computations in an Artificial Neural Network (ANN).

In some implementations, the Deep Learning Accelerator (DLA) lacks some of the logic operation capabilities of a typical Central Processing Unit (CPU). However, the Deep Learning Accelerator (DLA) can be configured with sufficient logic units to process the input data provided to an Artificial Neural Network (ANN) and generate the output of the Artificial Neural Network (ANN) according to a set of instructions generated for the Deep Learning Accelerator (DLA). Thus, the Deep Learning Accelerator (DLA) can perform the computation of an Artificial Neural Network (ANN) with little or no help from a Central Processing Unit (CPU) or another processor. Optionally, a conventional general purpose processor can also be configured as part of the Deep Learning Accelerator (DLA) to perform operations that cannot be implemented efficiently using the vector/matrix processing units of the Deep Learning Accelerator (DLA), and/or that cannot be performed by the vector/matrix processing units of the Deep Learning Accelerator (DLA).

A typical Artificial Neural Network (ANN) can be described/specified in a standard format (e.g., Open Neural Network Exchange (ONNX)). A compiler can be used to convert the description of the Artificial Neural Network (ANN) into a set of instructions for the Deep Learning Accelerator (DLA) to perform calculations of the Artificial Neural Network (ANN). The compiler can optimize the set of instructions to improve the performance of the Deep Learning Accelerator (DLA) in implementing the Artificial Neural Network (ANN).

The Deep Learning Accelerator (DLA) can have local memory, such as registers, buffers and/or caches, configured to store vector/matrix operands and the results of vector/matrix operations. Intermediate results in the registers can be pipelined/shifted in the Deep Learning Accelerator (DLA) as operands for subsequent vector/matrix operations to reduce time and energy consumption in accessing memory/data and thus speed up typical patterns of vector/matrix operations in implementing a typical Artificial Neural Network (ANN). The capacity of registers, buffers and/or caches in the Deep Learning Accelerator (DLA) is typically insufficient to hold the entire data set for implementing the computation of a typical Artificial Neural Network (ANN). Thus, a random access memory coupled to the Deep Learning Accelerator (DLA) is configured to provide an improved data storage capability for implementing a typical Artificial Neural Network (ANN). For example, the Deep Learning Accelerator (DLA) loads data and instructions from the random access memory and stores results back into the random access memory.

The communication bandwidth between the Deep Learning Accelerator (DLA) and the random access memory is configured to optimize or maximize the utilization of the computation power of the Deep Learning Accelerator (DLA). For example, high communication bandwidth can be provided between the Deep Learning Accelerator (DLA) and the random access memory such that vector/matrix operands can be loaded from the random access memory into the Deep Learning Accelerator (DLA) and results stored back into the random access memory in a time period that is approximately equal to the time for the Deep Learning Accelerator (DLA) to perform the computations on the vector/matrix operands. The granularity of the Deep Learning Accelerator (DLA) can be configured to increase the ratio between the amount of computations performed by the Deep Learning Accelerator (DLA) and the size of the vector/matrix operands such that the data access traffic between the Deep Learning Accelerator (DLA) and the random access memory can be reduced, which can reduce the requirement on the communication bandwidth between the Deep Learning Accelerator (DLA) and the random access memory. Thus, the bottleneck in data/memory access can be reduced or eliminated.

In at least some embodiments, multiple connections are provided to allow different devices to access the random access memory in parallel for different purposes. For example, the random access memory can include a portion configured to store input to the Artificial Neural Network (ANN) and another portion configured to store output from the Artificial Neural Network (ANN). One connection to the random access memory can be used by the Central Processing Unit (CPU) or another processor to access the output from the Artificial Neural Network (ANN), while concurrently another connection to the random access memory can be used by a Direct Memory Access (DMA) controller to store into the random access memory input data for the Artificial Neural Network (ANN).

For example, the Central Processing Unit (CPU) can set up the Direct Memory Access (DMA) controller to write, into an input region of the random access memory, input data to be processed by the Artificial Neural Network (ANN). The completion of the Direct Memory Access (DMA) controller writing a set of input into the input region can trigger the Deep Learning Accelerator (DLA) to execute the instructions to implement Artificial Neural Network (ANN). The execution of the instructions results in the combination of the input with the matrices of the Artificial Neural Network (ANN) to generate output. The output is configured to be stored in another region of the random access memory for the Central Processing Unit (CPU).

Optionally, the model data of an Artificial Neural Network (ANN) can be stored in a further region of the random access memory. The model data can include the matrices identifying neural connectivity and synaptic weights of artificial neurons, states and/or properties of artificial neurons in the Artificial Neural Network (ANN). The model data can further include the instructions for the Deep Learning Accelerator (DLA) to implement the computation of the Artificial Neural Network (ANN). For example, a compiler can convert a description of the Artificial Neural Network (ANN) into the model data stored in the random access memory.

After the model data is stored in the random access memory and the Direct Memory Access (DMA) controller is configured to write input data into the random access memory, the Deep Learning Accelerator (DLA) and the Direct Memory Access (DMA) controller can process the input data using the Artificial Neural Network (ANN) without help from the Central Processing Unit (CPU). The output of the Artificial Neural Network (ANN) is automatically stored in the random access memory. The Central Processing Unit (CPU) can access the random access memory via a separate connection concurrently with the Direct Memory Access (DMA) controller providing input data to the Deep Learning Accelerator (DLA).

For example, a stream of input data to the Artificial Neural Network (ANN) can be configured in the form of a sequence of input data sets. Each input data set is for a set of input to the Artificial Neural Network (ANN) during a time slot. While the Deep Learning Accelerator (DLA) is computing the output from the current set of input, the Direct Memory Access (DMA) controller can store the next set of input into the random access memory; and the Central Processing Unit (CPU) can concurrently retrieve, from the random access memory, the output generated for the previous set of input.

Thus, the task of preparation and processing of input data to an Artificial Neural Network (ANN) can be offloaded from the Central Processing Unit (CPU). The combination of the Deep Learning Accelerator (DLA), random access memory and the Direct Memory Access (DMA) controller can function as an independent supplier of results from an Artificial Neural Network (ANN) to the Central Processing Unit (CPU). The Central Processing Unit (CPU) can retrieve a set of output at a time when the output is needed. The Central Processing Unit (CPU) can instruct the Direct Memory Access (DMA) controller to pause its operations in supplying input to the Artificial Neural Network (ANN) when output from the Artificial Neural Network (ANN) is not required. Subsequently, when output from the Artificial Neural Network (ANN) is needed, the Central Processing Unit (CPU) can instruct the Direct Memory Access (DMA) controller to resume its operations of loading input data into the random access memory.

FIG. 1 shows an integrated circuit device (101) having a Deep Learning Accelerator (103) and random access memory (105) configured according to one embodiment.

The Deep Learning Accelerator (103) in FIG. 1 includes processing units (111), a control unit (113), and local memory (115). When vector and matrix operands are in the local memory (115), the control unit (113) can use the processing units (111) to perform vector and matrix operations in accordance with instructions. Further, the control unit (113) can load instructions and operands from the random access memory (105) through a memory interface (117) and a high speed/bandwidth connection (119).

The integrated circuit device (101) is configured to be enclosed within an integrated circuit package with pins or contacts for a memory controller interface (107).

The memory controller interface (107) is configured to support a standard memory access protocol such that the integrated circuit device (101) appears to a typical memory controller in a way same as a conventional random access memory device having no Deep Learning Accelerator (DLA) (103). For example, a memory controller external to the integrated circuit device (101) can access, using a standard memory access protocol through the memory controller interface (107), the random access memory (105) in the integrated circuit device (101).

The integrated circuit device (101) is configured with a high bandwidth connection (119) between the random access memory (105) and the Deep Learning Accelerator (DLA) (103) that are enclosed within the integrated circuit device (101). The bandwidth of the connection (119) is higher than the bandwidth of the connection (109) between the random access memory (105) and the memory controller interface (107).

In one embodiment, both the memory controller interface (107) and the memory interface (117) are configured to access the random access memory (105) via a same set of buses or wires. Thus, the bandwidth to access the random access memory (105) is shared between the memory interface (117) and the memory controller interface (107). Alternatively, the memory controller interface (107) and the memory interface (117) are configured to access the random access memory (105) via separate sets of buses or wires. Optionally, the random access memory (105) can include multiple sections that can be accessed concurrently via the connection (119). For example, when the memory interface (117) is accessing a section of the random access memory (105), the memory control interface (107) can concurrently access another section of the random access memory (105). For example, the different sections can be configured on different integrated circuit dies and/or different planes/banks of memory cells; and the different sections can be accessed in parallel to increase throughput in accessing the random access memory (105). For example, the memory controller interface (107) is configured to access one data unit of a predetermined size at a time; and the memory interface (117) is configured to access multiple data units, each of the same predetermined size, at a time.

In one embodiment, the random access memory (105) and the integrated circuit device (101) are configured on different integrated circuit dies configured within a same integrated circuit package. Further, the random access memory (105) can be configured on one or more integrated circuit dies that allows parallel access of multiple data elements concurrently.

In some implementations, the number of data elements of a vector or matrix that can be accessed in parallel over the connection (119) corresponds to the granularity of the Deep Learning Accelerator (DLA) operating on vectors or matrices. For example, when the processing units (111) can operate on a number of vector/matrix elements in parallel, the connection (119) is configured to load or store the same number, or multiples of the number, of elements via the connection (119) in parallel.

Optionally, the data access speed of the connection (119) can be configured based on the processing speed of the Deep Learning Accelerator (DLA) (103). For example, after an amount of data and instructions have been loaded into the local memory (115), the control unit (113) can execute an instruction to operate on the data using the processing units (111) to generate output. Within the time period of processing to generate the output, the access bandwidth of the connection (119) allows the same amount of data and instructions to be loaded into the local memory (115) for the next operation and the same amount of output to be stored back to the random access memory (105). For example, while the control unit (113) is using a portion of the local memory (115) to process data and generate output, the memory interface (117) can offload the output of a prior operation into the random access memory (105) from, and load operand data and instructions into, another portion of the local memory (115). Thus, the utilization and performance of the Deep Learning Accelerator (DLA) are not restricted or reduced by the bandwidth of the connection (119).

The random access memory (105) can be used to store the model data of an Artificial Neural Network (ANN) and to buffer input data for the Artificial Neural Network (ANN). The model data does not change frequently. The model data can include the output generated by a compiler for the Deep Learning Accelerator (DLA) to implement the Artificial Neural Network (ANN). The model data typically includes matrices used in the description of the Artificial Neural Network (ANN) and instructions generated for the Deep Learning Accelerator (DLA) (103) to perform vector/matrix operations of the Artificial Neural Network (ANN) based on vector/matrix operations of the granularity of the Deep Learning Accelerator (DLA) (103). The instructions operate not only on the vector/matrix operations of the Artificial Neural Network (ANN), but also on the input data for the Artificial Neural Network (ANN).

In one embodiment, when the input data is loaded or updated in the random access memory (105), the control unit (113) of the Deep Learning Accelerator (DLA) (103) can automatically execute the instructions for the Artificial Neural Network (ANN) to generate an output of the Artificial Neural Network (ANN). The output is stored into a predefined region in the random access memory (105). The Deep Learning Accelerator (DLA) (103) can execute the instructions without help from a Central Processing Unit (CPU).

Thus, communications for the coordination between the Deep Learning Accelerator (DLA) (103) and a processor outside of the integrated circuit device (101) (e.g., a Central Processing Unit (CPU)) can be reduced or eliminated.

Optionally, the logic circuit of the Deep Learning Accelerator (DLA) (103) can be implemented via Complementary Metal Oxide Semiconductor (CMOS). For example, the technique of CMOS Under the Array (CUA) of memory cells of the random access memory (105) can be used to implement the logic circuit of the Deep Learning Accelerator (DLA) (103), including the processing units (111) and the control unit (113). Alternatively, the technique of CMOS in the Array of memory cells of the random access memory (105) can be used to implement the logic circuit of the Deep Learning Accelerator (DLA) (103).

In some implementations, the Deep Learning Accelerator (DLA) (103) and the random access memory (105) can be implemented on separate integrated circuit dies and connected using Through-Silicon Vias (TSV) for increased data bandwidth between the Deep Learning Accelerator (DLA) (103) and the random access memory (105). For example, the Deep Learning Accelerator (DLA) (103) can be formed on an integrated circuit die of a Field-Programmable Gate Array (FPGA) or Application Specific Integrated circuit (ASIC).

Alternatively, the Deep Learning Accelerator (DLA) (103) and the random access memory (105) can be configured in separate integrated circuit packages and connected via multiple point-to-point connections on a printed circuit board (PCB) for parallel communications and thus increased data transfer bandwidth.

The random access memory (105) can be volatile memory or non-volatile memory, or a combination of volatile memory and non-volatile memory. Examples of non-volatile memory include flash memory, memory cells formed based on negative-and (NAND) logic gates, negative-or (NOR) logic gates, Phase-Change Memory (PCM), magnetic memory (MRAM), resistive random-access memory, cross point storage and memory devices. A cross point memory device can use transistor-less memory elements, each of which has a memory cell and a selector that are stacked together as a column. Memory element columns are connected via two layers of wires running in perpendicular directions, where wires of one layer run in one direction in the layer that is located above the memory element columns, and wires of the other layer run in another direction and are located below the memory element columns. Each memory element can be individually selected at a cross point of one wire on each of the two layers. Cross point memory devices are fast and non-volatile and can be used as a unified memory pool for processing and storage. Further examples of non-volatile memory include Read-Only Memory (ROM), Programmable Read-Only Memory (PROM), Erasable Programmable Read-Only Memory (EPROM) and Electronically Erasable Programmable Read-Only Memory (EEPROM) memory, etc. Examples of volatile memory include Dynamic Random-Access Memory (DRAM) and Static Random-Access Memory (SRAM).

For example, non-volatile memory can be configured to implement at least a portion of the random access memory (105). The non-volatile memory in the random access memory (105) can be used to store the model data of an Artificial Neural Network (ANN). Thus, after the integrated circuit device (101) is powered off and restarts, it is not necessary to reload the model data of the Artificial Neural Network (ANN) into the integrated circuit device (101). Further, the non-volatile memory can be programmable/rewritable. Thus, the model data of the Artificial Neural Network (ANN) in the integrated circuit device (101) can be updated or replaced to implement an update Artificial Neural Network (ANN), or another Artificial Neural Network (ANN).

The processing units (111) of the Deep Learning Accelerator (DLA) (103) can include vector-vector units, matrix-vector units, and/or matrix-matrix units. Examples of units configured to perform for vector-vector operations, matrix-vector operations, and matrix-matrix operations are discussed below in connection with FIGS. 2-4.

Figure 2:
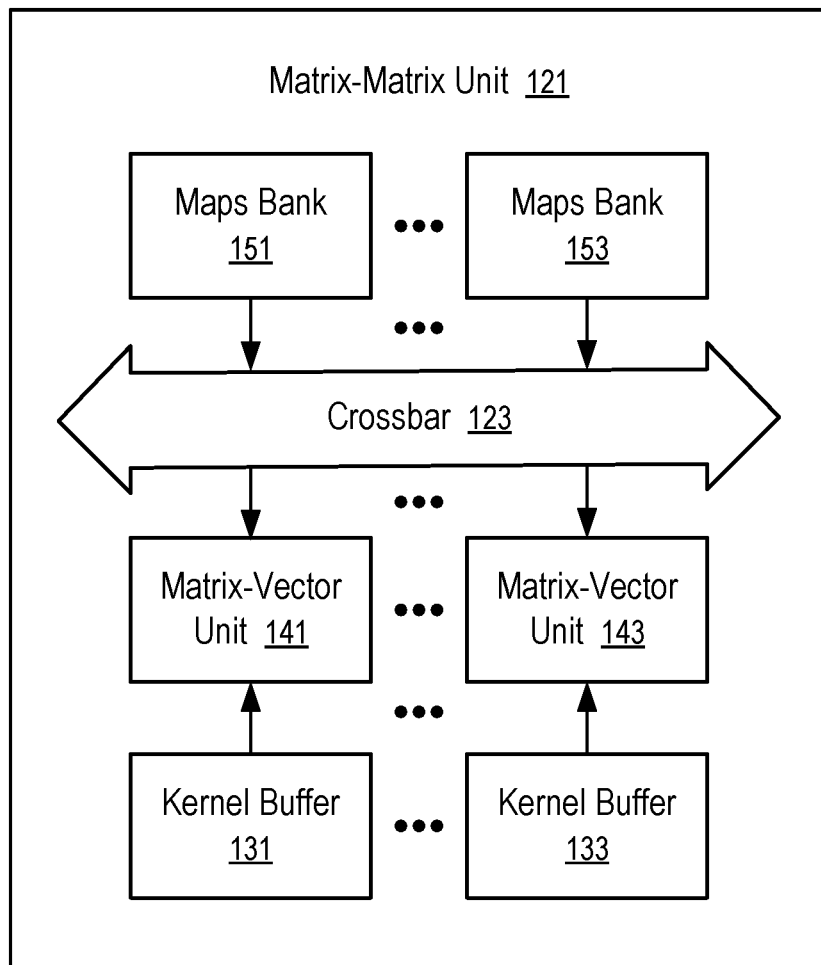
FIG. 2 shows a processing unit configured to perform matrix-matrix operations according to one embodiment.

FIG. 2 shows a processing unit (121) configured to perform matrix-matrix operations according to one embodiment. For example, the matrix-matrix unit (121) of FIG. 2 can be used as one of the processing units (111) of the Deep Learning Accelerator (DLA) (103) of FIG. 1.

In FIG. 2, the matrix-matrix unit (121) includes multiple kernel buffers (131 to 133) and multiple the maps banks (151 to 153). Each of the maps banks (151 to 153) stores one vector of a matrix operand that has multiple vectors stored in the maps banks (151 to 153) respectively; and each of the kernel buffers (131 to 133) stores one vector of another matrix operand that has multiple vectors stored in the kernel buffers (131 to 133) respectively. The matrix-matrix unit (121) is configured to perform multiplication and accumulation operations on the elements of the two matrix operands, using multiple matrix-vector units (141 to 143) that operate in parallel.

A cross bar (123) connects the maps banks (151 to 153) to the matrix-vector units (141 to 143). The same matrix operand stored in the maps bank (151 to 153) is provided via the crossbar (123) to each of the matrix-vector units (141 to 143); and the matrix-vector units (141 to 143) receives data elements from the maps banks (151 to 153) in parallel. Each of the kernel buffers (131 to 133) is connected to a respective one in the matrix-vector units (141 to 143) and provides a vector operand to the respective matrix-vector unit. The matrix-vector units (141 to 143) operate concurrently to compute the operation of the same matrix operand, stored in the maps banks (151 to 153) multiplied by the corresponding vectors stored in the kernel buffers (131 to 133). For example, the matrix-vector unit (141) performs the multiplication operation on the matrix operand stored in the maps banks (151 to 153) and the vector operand stored in the kernel buffer (131), while the matrix-vector unit (143) is concurrently performing the multiplication operation on the matrix operand stored in the maps banks (151 to 153) and the vector operand stored in the kernel buffer (133).

Figure 3:
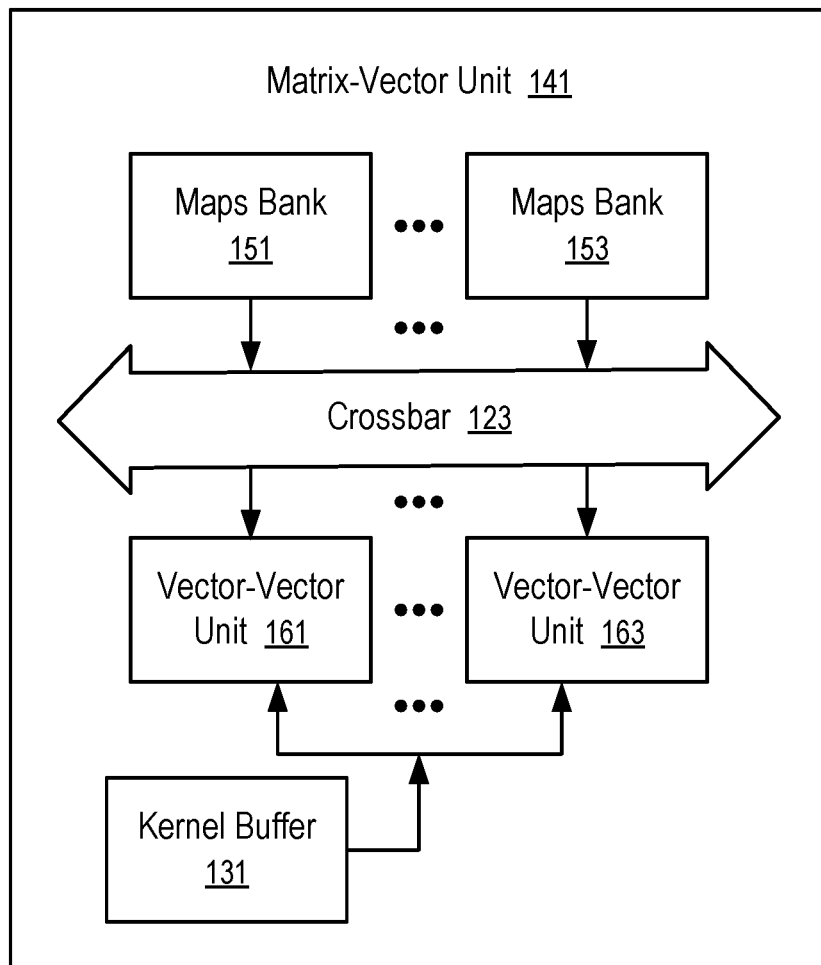
FIG. 3 shows a processing unit configured to perform matrix-vector operations according to one embodiment.

Each of the matrix-vector units (141 to 143) in FIG. 2 can be implemented in a way as illustrated in FIG. 3.

FIG. 3 shows a processing unit (141) configured to perform matrix-vector operations according to one embodiment. For example, the matrix-vector unit (141) of FIG. 3 can be used as any of the matrix-vector units in the matrix-matrix unit (121) of FIG. 2.

In FIG. 3, each of the maps banks (151 to 153) stores one vector of a matrix operand that has multiple vectors stored in the maps banks (151 to 153) respectively, in a way similar to the maps banks (151 to 153) of FIG. 2. The crossbar (123) in FIG. 3 provides the vectors from the maps banks (151) to the vector-vector units (161 to 163) respectively. A same vector stored in the kernel buffer (131) is provided to the vector-vector units (161 to 163).

The vector-vector units (161 to 163) operate concurrently to compute the operation of the corresponding vector operands, stored in the maps banks (151 to 153) respectively, multiplied by the same vector operand that is stored in the kernel buffer (131). For example, the vector-vector unit (161) performs the multiplication operation on the vector operand stored in the maps bank (151) and the vector operand stored in the kernel buffer (131), while the vector-vector unit (163) is concurrently performing the multiplication operation on the vector operand stored in the maps bank (153) and the vector operand stored in the kernel buffer (131).

When the matrix-vector unit (141) of FIG. 3 is implemented in a matrix-matrix unit (121) of FIG. 2, the matrix-vector unit (141) can use the maps banks (151 to 153), the crossbar (123) and the kernel buffer (131) of the matrix-matrix unit (121).

Figure 4:
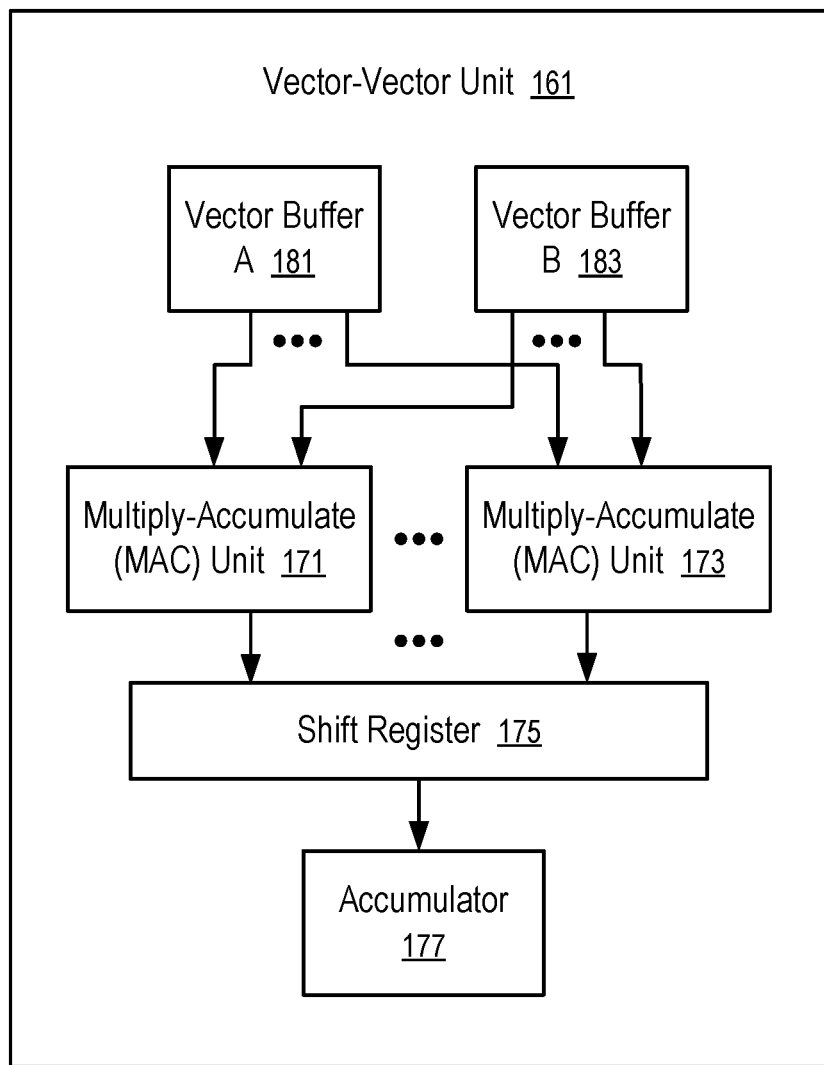
FIG. 4 shows a processing unit configured to perform vector-vector operations according to one embodiment.

Each of the vector-vector units (161 to 163) in FIG. 3 can be implemented in a way as illustrated in FIG. 4.

FIG. 4 shows a processing unit (161) configured to perform vector-vector operations according to one embodiment. For example, the vector-vector unit (161) of FIG. 4 can be used as any of the vector-vector units in the matrix-vector unit (141) of FIG. 3.

In FIG. 4, the vector-vector unit (161) has multiple multiply-accumulate (MAC) units (171 to 173). Each of the multiply-accumulate (MAC) units (171 to 173) can receive two numbers as operands, perform multiplication of the two numbers, and add the result of the multiplication to a sum maintained in the multiply-accumulate (MAC) unit.

Each of the vector buffers (181 and 183) stores a list of numbers. A pair of numbers, each from one of the vector buffers (181 and 183), can be provided to each of the multiply-accumulate (MAC) units (171 to 173) as input. The multiply-accumulate (MAC) units (171 to 173) can receive multiple pairs of numbers from the vector buffers (181 and 183) in parallel and perform the multiply-accumulate (MAC) operations in parallel. The outputs from the multiply-accumulate (MAC) units (171 to 173) are stored into the shift register (175); and an accumulator (177) computes the sum of the results in the shift register (175).

When the vector-vector unit (161) of FIG. 4 is implemented in a matrix-vector unit (141) of FIG. 3, the vector-vector unit (161) can use a maps bank (e.g., 151 or 153) as one vector buffer (181), and the kernel buffer (131) of the matrix-vector unit (141) as another vector buffer (183).

The vector buffers (181 and 183) can have a same length to store the same number/count of data elements. The length can be equal to, or the multiple of, the count of multiply-accumulate (MAC) units (171 to 173) in the vector-vector unit (161). When the length of the vector buffers (181 and 183) is the multiple of the count of multiply-accumulate (MAC) units (171 to 173), a number of pairs of inputs, equal to the count of the multiply-accumulate (MAC) units (171 to 173), can be provided from the vector buffers (181 and 183) as inputs to the multiply-accumulate (MAC) units (171 to 173) in each iteration; and the vector buffers (181 and 183) feed their elements into the multiply-accumulate (MAC) units (171 to 173) through multiple iterations.

In one embodiment, the communication bandwidth of the connection (119) between the Deep Learning Accelerator (DLA) (103) and the random access memory (105) is sufficient for the matrix-matrix unit (121) to use portions of the random access memory (105) as the maps banks (151 to 153) and the kernel buffers (131 to 133).

In another embodiment, the maps banks (151 to 153) and the kernel buffers (131 to 133) are implemented in a portion of the local memory (115) of the Deep Learning Accelerator (DLA) (103). The communication bandwidth of the connection (119) between the Deep Learning Accelerator (DLA) (103) and the random access memory (105) is sufficient to load, into another portion of the local memory (115), matrix operands of the next operation cycle of the matrix-matrix unit (121), while the matrix-matrix unit (121) is performing the computation in the current operation cycle using the maps banks (151 to 153) and the kernel buffers (131 to 133) implemented in a different portion of the local memory (115) of the Deep Learning Accelerator (DLA) (103).

Figure 5:
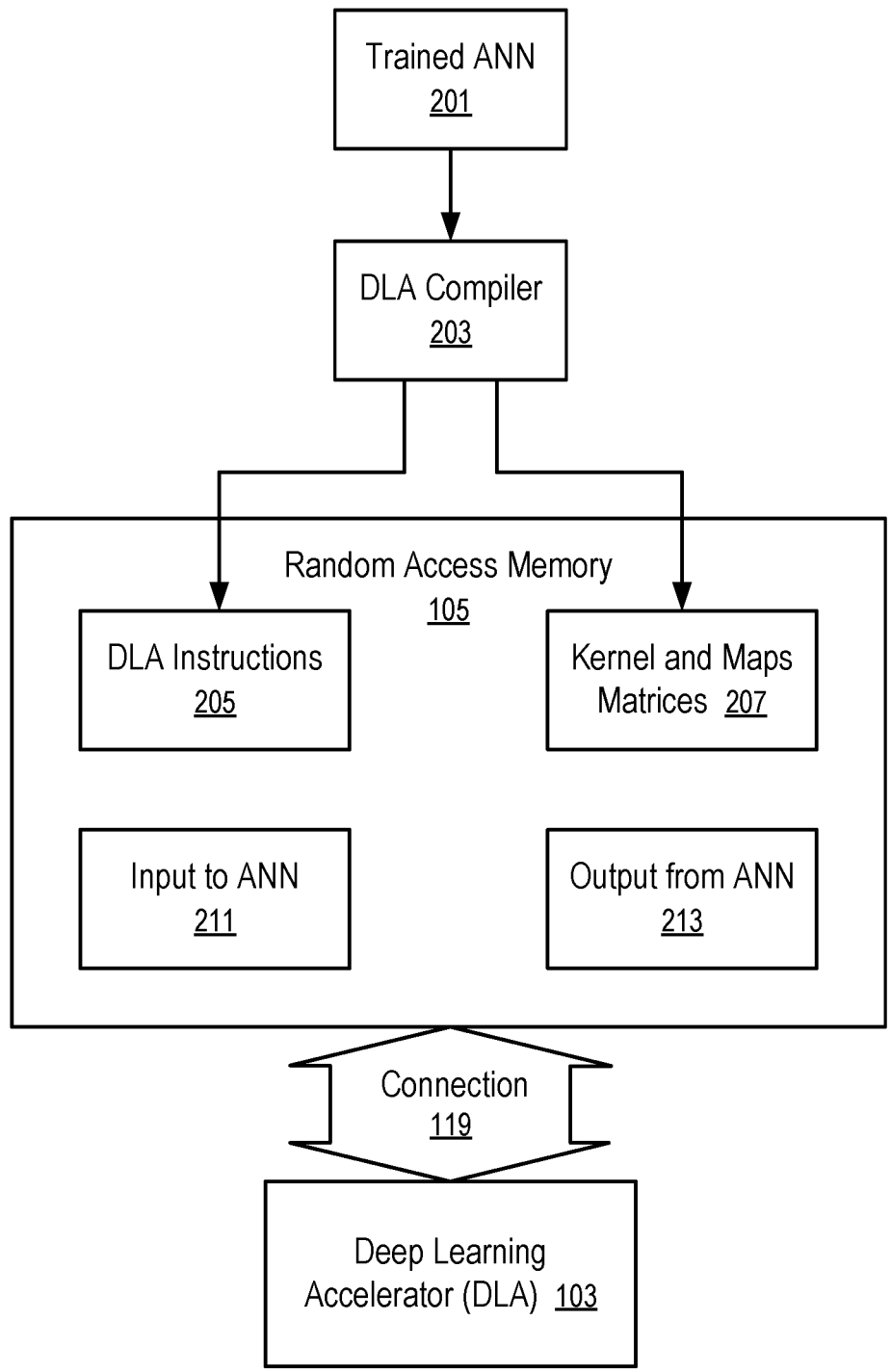
FIG. 5 shows a Deep Learning Accelerator and random access memory configured to autonomously apply inputs to a trained Artificial Neural Network according to one embodiment.

FIG. 5 shows a Deep Learning Accelerator and random access memory configured to autonomously apply inputs to a trained Artificial Neural Network according to one embodiment.

An Artificial Neural Network (ANN) (201) that has been trained through machine learning (e.g., deep learning) can be described in a standard format (e.g., Open Neural Network Exchange (ONNX)). The description of the trained ANN (201) in the standard format identifies the properties of the artificial neurons and their connectivity.

In FIG. 5, a Deep Learning Accelerator (DLA) compiler (203) converts trained ANN (201) by generating instructions (205) for a Deep Learning Accelerator (DLA) (103) and matrices (207) corresponding to the properties of the artificial neurons and their connectivity. The instructions (205) and the matrices (207) generated by the DLA compiler (203) from the trained ANN (201) can be stored in random access memory (105) for the Deep Learning Accelerator (DLA) (103).

For example, the random access memory (105) and the Deep Learning Accelerator (DLA) (103) can be connected via a high bandwidth connection (119) in a way as in the integrated circuit device (101) of FIG. 1. The autonomous computation of FIG. 5 based on the instructions (205) and the matrices (207) can be implemented in the integrated circuit device (101) of FIG. 1. Alternatively, the random access memory (105) and the Deep Learning Accelerator (DLA) (103) can be configured on a printed circuit board with multiple point to point serial buses running in parallel to implement the connection (119).

In FIG. 5, after the results of the DLA compiler (203) are stored in the random access memory (105), the application of the trained ANN (201) to process an input (211) to the trained ANN (201) to generate the corresponding output (213) of the trained ANN (213) can be triggered by the presence of the input (211) in the random access memory (105), or another indication provided in the random access memory (105).

In response, the Deep Learning Accelerator (DLA) (103) executes the instructions (205) to combine the input (211) and the matrices (207). The execution of the instructions (205) can include the generation of maps matrices for the maps banks (151 to 153) of one or more matrix-matrix units (e.g., 121) of the Deep Learning Accelerator (DLA) (103).

In some embodiments, the inputs to ANN (211) is in the form of an initial maps matrix. Portions of the initial maps matrix can be retrieved from the random access memory (105) as the matrix operand stored in the maps banks (151 to 153) of a matrix-matrix unit (121). Alternatively, the DLA instructions (205) also include instructions for the Deep Learning Accelerator (DLA) (103) to generate the initial maps matrix from the input (211).

According to the DLA instructions (205), the Deep Learning Accelerator (DLA) (103) loads matrix operands into the kernel buffers (131 to 133) and maps banks (151 to 153) of its matrix-matrix unit (121). The matrix-matrix unit (121) performs the matrix computation on the matrix operands. For example, the DLA instructions (205) break down matrix computations of the trained ANN (201) according to the computation granularity of the Deep Learning Accelerator (DLA) (103) (e.g., the sizes/dimensions of matrices that loaded as matrix operands in the matrix-matrix unit (121)) and applies the input feature maps to the kernel of a layer of artificial neurons to generate output as the input for the next layer of artificial neurons.

Upon completion of the computation of the trained ANN (201) performed according to the instructions (205), the Deep Learning Accelerator (DLA) (103) stores the output (213) of the ANN (201) at a pre-defined location in the random access memory (105), or at a location specified in an indication provided in the random access memory (105) to trigger the computation.

When the technique of FIG. 5 is implemented in the integrated circuit device (101) of FIG. 1, an external device connected to the memory controller interface (107) can write the input (211) into the random access memory (105) and trigger the autonomous computation of applying the input (211) to the trained ANN (201) by the Deep Learning Accelerator (DLA) (103). After a period of time, the output (213) is available in the random access memory (105); and the external device can read the output (213) via the memory controller interface (107) of the integrated circuit device (101).

For example, a predefined location in the random access memory (105) can be configured to store an indication to trigger the autonomous execution of the instructions (205) by the Deep Learning Accelerator (DLA) (103). The indication can optionally include a location of the input (211) within the random access memory (105). Thus, during the autonomous execution of the instructions (205) to process the input (211), the external device can retrieve the output generated during a previous run of the instructions (205), and/or store another set of input for the next run of the instructions (205).

Optionally, a further predefined location in the random access memory (105) can be configured to store an indication of the progress status of the current run of the instructions (205). Further, the indication can include a prediction of the completion time of the current run of the instructions (205) (e.g., estimated based on a prior run of the instructions (205)). Thus, the external device can check the completion status at a suitable time window to retrieve the output (213).

In some embodiments, the random access memory (105) is configured with sufficient capacity to store multiple sets of inputs (e.g., 211) and outputs (e.g., 213). Each set can be configured in a predetermined slot/area in the random access memory (105).

The Deep Learning Accelerator (DLA) (103) can execute the instructions (205) autonomously to generate the output (213) from the input (211) according to matrices (207) stored in the random access memory (105) without helps from a processor or device that is located outside of the integrated circuit device (101).

In a method according to one embodiment, random access memory (105) of a computing device (e.g., 101) can be accessed using an interface (107) of the computing device (e.g., 101) to a memory controller. The computing device (e.g., 101) can have processing units (e.g., 111) configured to perform at least computations on matrix operands, such as a matrix operand stored in maps banks (151 to 153) and a matrix operand stored in kernel buffers (131 to 133).

For example, the computing device (e.g., 101) can be enclosed within an integrated circuit package; and a set of connections can connect the interface (107) to the memory controller that is located outside of the integrated circuit package.

Instructions (205) executable by the processing units (e.g., 111) can be written into the random access memory (105) through the interface (107).

Matrices (207) of an Artificial Neural Network (201) can be written into the random access memory (105) through the interface (107). The matrices (207) identify the property and/or state of the Artificial Neural Network (201).

Optionally, at least a portion of the random access memory (105) is non-volatile and configured to store the instructions (205) and the matrices (07) of the Artificial Neural Network (201).

First input (211) to the Artificial Neural Network can be written into the random access memory (105) through the interface (107).

An indication is provided in the random access memory (105) to cause the processing units (111) to start execution of the instructions (205). In response to the indication, the processing units (111) execute the instructions to combine the first input (211) with the matrices (207) of the Artificial Neural Network (201) to generate first output (213) from the Artificial Neural Network (201) and store the first output (213) in the random access memory (105).

For example, the indication can be an address of the first input (211) in the random access memory (105); and the indication can be stored a predetermined location in the random access memory (105) to cause the initiation of the execution of the instructions (205) for the input (211) identified by the address. Optionally, the indication can also include an address for storing the output (213).

The first output (213) can be read, through the interface (107), from the random access memory (105).

For example, the computing device (e.g., 101) can have a Deep Learning Accelerator (103) formed on a first integrated circuit die (e.g., 405) and the random access memory (105) formed on one or more second integrated circuit dies (e.g., 401 and 403). The connection (119) between the first integrated circuit die and the one or more second integrated circuit dies can include Through-Silicon Vias (TSVs) (e.g., 407) to provide high bandwidth for memory access.

For example, a description of the Artificial Neural Network (201) can be converted using a compiler (203) into the instructions (205) and the matrices (207). The combination of the instructions (205) and the matrices (207) stored in the random access memory (105) and the Deep Learning Accelerator (103) provides an autonomous implementation of the Artificial Neural Network (201) that can automatically convert input (211) to the Artificial Neural Network (201) to its output (213).

For example, during a time period in which the Deep Learning Accelerator (103) executes the instructions (205) to generate the first output (213) from the first input (211) according to the matrices (207) of the Artificial Neural Network (201), the second input to Artificial Neural Network (201) can be written into the random access memory (105) through the interface (107) at an alternative location. After the first output (213) is stored in the random access memory (105), an indication can be provided in the random access memory to cause the Deep Learning Accelerator (103) to again start the execution of the instructions and generate second output from the second input.

During the time period in which the Deep Learning Accelerator (103) executes the instructions (205) to generate the second output from the second input according to the matrices (207) of the Artificial Neural Network (201), the first output (213) can be read from the random access memory (105) through the interface (107); and a further input can be written into the random access memory to replace the first input (211), or written at a different location. The process can be repeated for a sequence of inputs.

The Deep Learning Accelerator (103) can include at least one matrix-matrix unit (121) that can execute an instruction on two matrix operands. The two matrix operands can be a first matrix and a second matrix. Each of two matrices has a plurality of vectors. The matrix-matrix unit (121) can include a plurality of matrix-vector units (141 to 143) configured to operate in parallel. Each of the matrix-vector units (141 to 143) are configured to operate, in parallel with other matrix-vector units, on the first matrix and one vector from second matrix. Further, each of the matrix-vector units (141 to 143) can have a plurality of vector-vector units (161 to 163) configured to operate in parallel. Each of the vector-vector units (161 to 163) is configured to operate, in parallel with other vector-vector units, on a vector from the first matrix and a common vector operand of the corresponding matrix-vector unit. Further, each of the vector-vector units (161 to 163) can have a plurality of multiply-accumulate units (171 to 173) configured to operate in parallel.

The Deep Learning Accelerator (103) can have local memory (115) and a control unit (113) in addition to the processing units (111). The control unit (113) can load instructions (205) and matrix operands (e.g., 207) from the random access memory (105) for execution by the processing units (111). The local memory can cache matrix operands used by the matrix-matrix unit. The connection (119) can be configured with a bandwidth sufficient to load a set of matrix operands from the random access memory (105) to the local memory (115) during a time period in which the matrix-matrix unit performs operations on two other matrix operands. Further, during the time period, the bandwidth is sufficient to store a result, generated by the matrix-matrix unit (121) in a prior instruction execution, from the local memory (115) to the random access memory (105).

Figure 6:
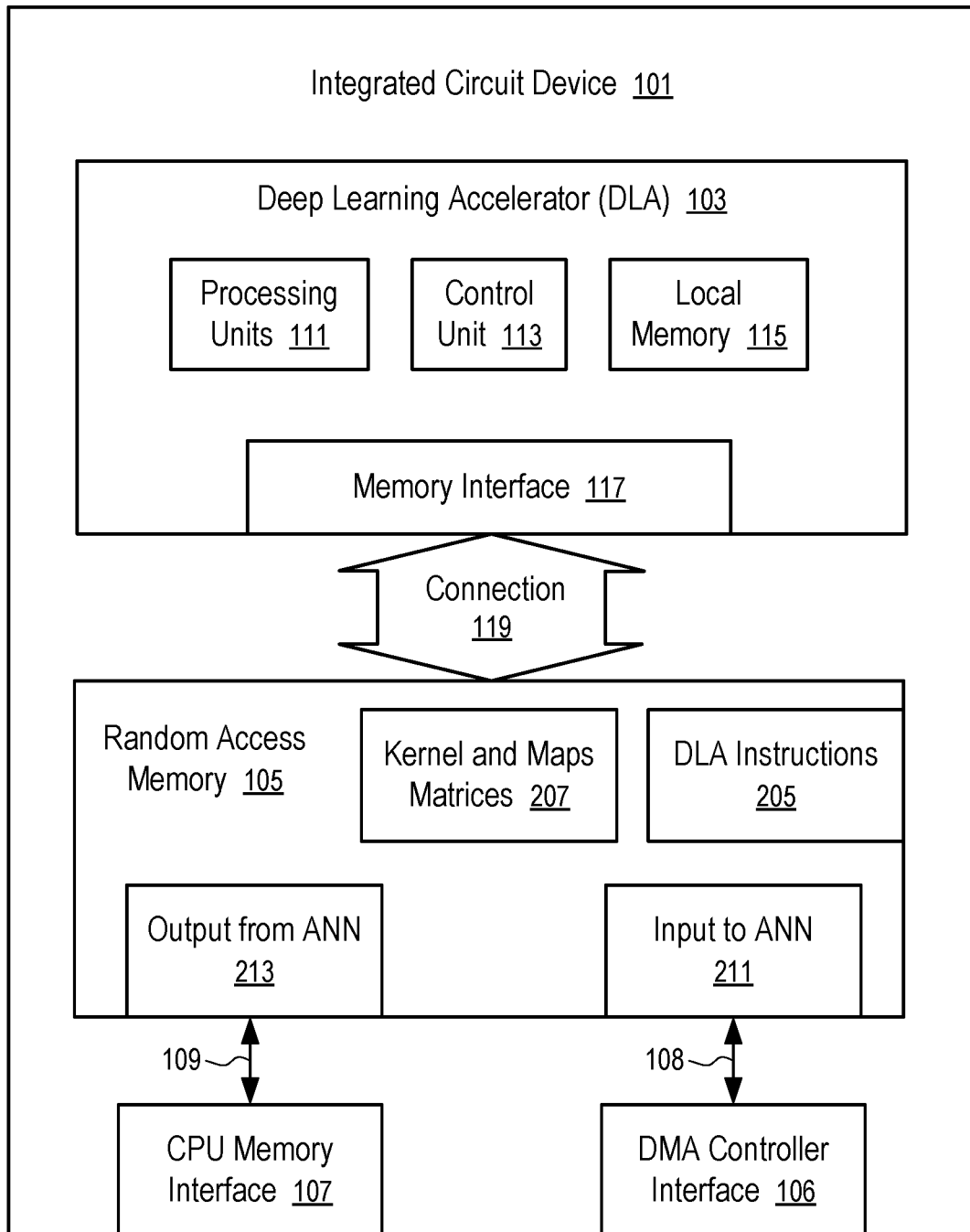
FIG. 6 shows an integrated circuit device having a Deep Learning Accelerator and random access memory configured with separate memory access connections according to one embodiment.

FIG. 6 shows an integrated circuit device (101) having a Deep Learning Accelerator (103) and random access memory (105) configured with separate memory access connections according to one embodiment.

For example, the Deep Learning Accelerator (103), the random access memory (105), and the connection (119) of the integrated circuit device (101) of FIG. 6 can be configured in a way similar to those illustrated in FIG. 1 and/or FIG. 5.

The integrated circuit device (101) of FIG. 6 has two external interfaces (106 and 107) that can be used to access the random access memory (105) concurrently.

For example, the random access memory (105) can have at least two portions that can be accessed concurrently and independently from reach other. Such portions can be configured on separate integrated circuit dies, or in separate planes or blocks of memory cells form on a same integrated circuit die. One portion is configured to store input (211) to the Artificial Neural Network (ANN) (201); and another portion is configured to store output (213) from the Artificial Neural Network (ANN) (201). The two external interfaces (106 and 107) configured with separate connections (108 and 109) to the portions for the input (211) and output (213) respectively. Thus, different devices external to the integrated circuit (101) can use the separate external interfaces (106 and 107) of the integrated circuit device (101) to access its random access memory (105) concurrently.

For example, a memory controller of a Central Processing Unit (CPU) can be connected to the CPU memory interface (107) to read prior output from the Artificial Neural Network (ANN) (201), while a Direct Memory Access (DMA) controller can be connected to the DMA controller interface (106) to write next input to the Artificial Neural Network (ANN) (201) concurrently.

In one embodiment, the connections (108 and 109) have separate sets of buses or wires. Thus, the external interfaces (106 and 107) do not share buses or wires in accessing the different portions of the random access memory (105) for the input (211) and the output (213). Alternatively, an access controller is configured to use separate buffers for the interfaces (106 and 107) and use the high bandwidth connection (119) to transfer data between the random access memory (105) and the buffers for the interfaces (106 and 107) such that the interfaces (106 and 107) can service write and read requests concurrently. Since the bandwidth of the connection (119) is substantially higher than the bandwidth used by the connections (108 and 109) to the external interfaces (106 and 107) of the integrated circuit device (101), a small portion of the bandwidth can be allocated to the connections (108 and 109). For example, the interfaces (106 and 107) can be connected to the memory interface (117) of the Deep Learning Accelerator (DLA) (103) to access the random access memory (105) via the connection (119).

Optionally, the memory interface (117) of the Deep Learning Accelerator (DLA) (103), the interface (107) to the memory controller of the Central Processing Unit (CPU), and the interface (106) can be configured to access the random access memory (105) concurrently.

For example, the random access memory (105) can be configured with at multiple sets of input/output memory. Each set can be selectively configured to service the memory interface (117) or service the external interfaces (106 and 107). When a set of input/output memory is selected to service the memory interface (117), the connection (119) allows the Deep Learning Accelerator (DLA) (103) to access input (e.g., 211) stored in the set and to store output (e.g., 213) from the Artificial Neural Network (ANN) (201) to the set. When a set of input/output memory is selected to service the external interfaces (106 and 107), the input (e.g., 211) and the output (e.g., 213) in different memory regions can be accessed concurrently by the separate external interfaces (106 and 107). While one set of input/output memory is allocated for the Deep Learning Accelerator (DLA) (103) to process a set of input (e.g., 211) and generate a corresponding set of output (e.g., 213), one or more sets of input/output memory can be concurrently made accessible to the external interfaces (106 and 107).

Figure 7:
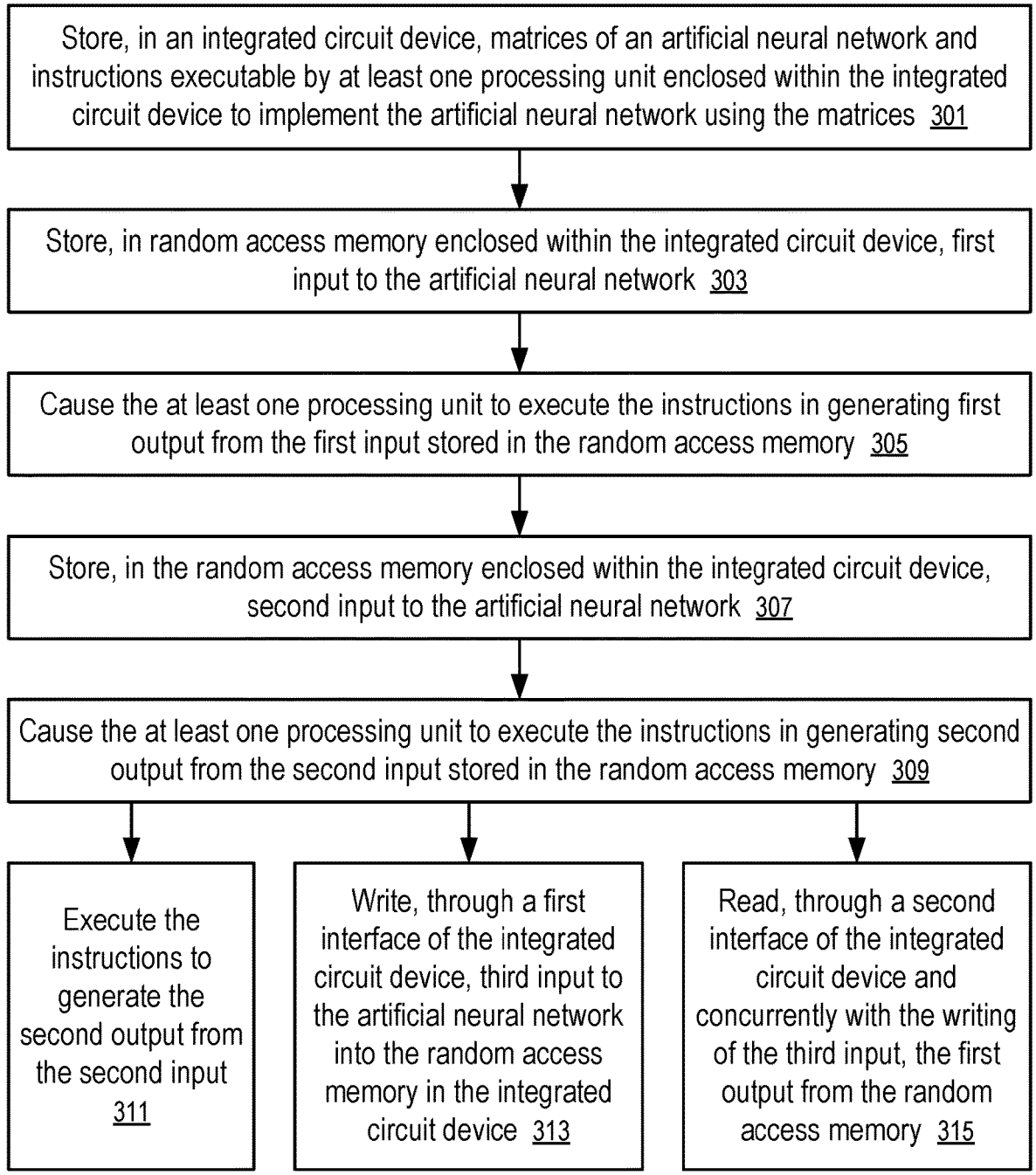
FIG. 7 shows a method implemented in an integrated circuit device according to one embodiment.
Figure 8:
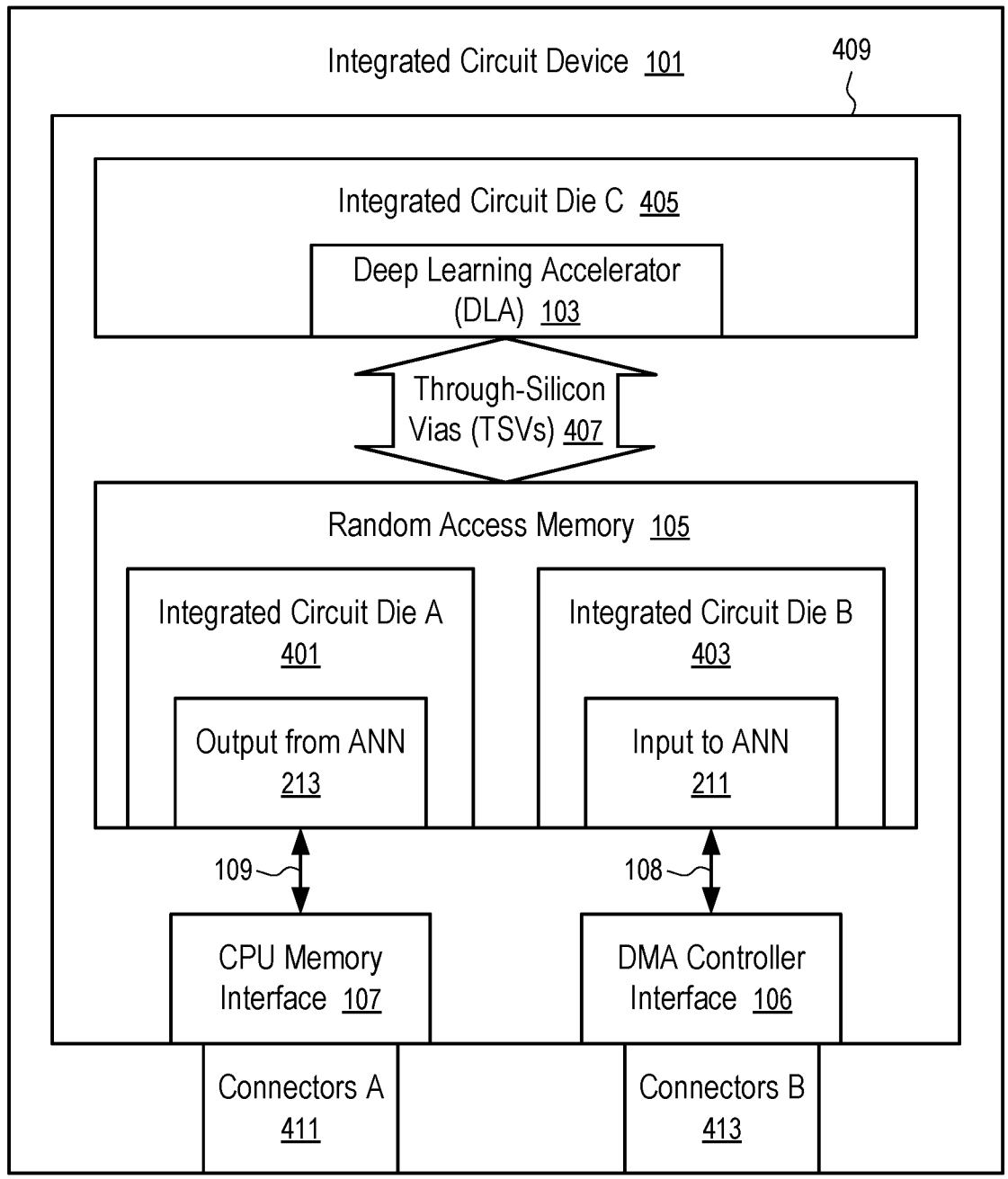
FIG. 8 shows an integrated circuit device having a Deep Learning Accelerator and random access memory configured with separate memory access connections according to one embodiment.

FIG. 7 shows a method implemented in an integrated circuit device according to one embodiment. For example, the method of FIG. 7 can be implemented in the integrated circuit device (101) of FIG. 6. However, the method of FIG. 7 can also be implemented in an alternatively packaged computing device similar to that illustrated in FIG. 5 but configured on a printed circuit board.

At block 301, an integrated circuit device (101) stores matrices (207) of an Artificial Neural Network (201) and instructions (205). The instructions (205) are executable by at least one processing unit (111) enclosed within the integrated circuit device (101) to implement the Artificial Neural Network (201) using the matrices (207).

The integrated circuit device (101), or the alternatively packaged computing device on a printed circuit board, has random access memory.

At block 303, the random access memory (105) enclosed within the integrated circuit device (101) stores first input to the Artificial Neural Network (201).

At block 305, the at least one processing unit (111) is caused or used to execute the instructions (205) in generating first output from the first input stored in the random access memory (105). The first output is stored in the random access memory (105).

At block 307, the random access memory (105) enclosed within the integrated circuit device (101) further stores second input to the Artificial Neural Network (201).

At block 309, the at least one processing unit (111) is caused or used to execute the instructions (205) in generating second output from the second input stored in the random access memory (105).

At block 311, the at least one processing unit (111) executes the instructions (205) to generate the second output from the second input.

While the at least one processing unit (111) is executing the instructions (205) to generate the second output from the second input, operations in blocks 313 and 315 can be performed in parallel.

At block 313, an external device (e.g., a direct memory access controller) writes, through a first interface (106) of the integrated circuit device (101), third input to the Artificial Neural Network (201) into the random access memory (105) in the integrated circuit device (101).

At block 315, another external device (e.g., a Central Processing Unit) reads the first output from the random access memory (105), through a second interface (107) of the integrated circuit device (101) and concurrently with the writing of the third input.

For example, the writing of the third input can be performed through the first interface (106) connected to a direct memory access controller; and the reading of the first output can be performed through the second interface (107) connected to a Central Processing Unit.

For example, the integrated circuit device (101) can be enclosed within an integrated circuit package and has a Deep Learning Accelerator (103) with processing units (111), a control unit (113) and local memory (115). The processing units (111) include at least a matrix-matrix unit (121) configured to execute an instruction having two matrix operands. The matrix-matrix unit (121) includes a plurality of matrix-vector units (141 to 143) configured to operate in parallel. Each of the matrix-vector units (141 to 143) includes a plurality of vector-vector units (161 to 163) configured to operate in parallel. Each of the vector-vector units (161 to 163) includes a plurality of multiply-accumulate units (171 to 173) configured to operate in parallel.

For example, a compiler (203) can be used to convert a description of the Artificial Neural Network (201) into the instructions (205) and the matrices (207) to implement the Artificial Neural Network (201) using the Deep Learning Accelerator (103).

In one implementation, the reading of the first output through the second interface (107), the writing of the third input through the first interface (106), the Deep Learning Accelerator (103) reading a portion of the second input, and the Deep Learning Accelerator (103) writing a portion of the second output into the random access memory can be performed in parallel and concurrently.

For example, the random access memory (105) can have multiple portions that are capable of being used concurrently and independent from each other. A first portion is configured to store the first output from the Artificial Neural Network (201); a second portion configured to store third input to the Artificial Neural Network (201); a third portion configured to store the second output from the Artificial Neural Network (201); and a fourth portion configured to store the second input to the Artificial Neural Network (201). When the third and fourth portions are being used by the Deep Learning Accelerator (103) in execution of the instructions (205), the first interface and the second interface can be connected concurrently to the first portion and second portion respectively.

For example, the different portions can be configured on separate integrated circuit dies (or planes or blocks) that can operate independent from each other in parallel. The first interface and the second interface can share no connections to the first portion and the second portion.

The integrated circuit device (101) can be enclosed within a single integrated circuit package (e.g., 409), with a first set of connectors (e.g., 413) configured to couple the first interface (106) to the direct memory access controller and a second set of connectors (e.g., 411) configured to couple the second interface (107) to the Central Processing Unit.

In some implementations, the Deep Learning Accelerator (103) has a memory interface (117) with a high bandwidth connection (119) to the random access memory (105); and the first interface (106) and the second interface (107) are connected to the random access memory (105) via the memory interface (117) of the Deep Learning Accelerator (103).

The present disclosure includes methods and apparatuses which perform the methods described above, including data processing systems which perform these methods, and computer readable media containing instructions which when executed on data processing systems cause the systems to perform these methods.

A typical data processing system may include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, Read Only Memory (ROM), Random Access Memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A device, comprising:
an integrated circuit package enclosing components of the device, the components enclosed within the integrated circuit package including:
an accelerator for deep learning, the accelerator having:
at least one processing unit configured to execute instructions, each of the instructions having one or more matrix operands and configured to instruct the at least one processing unit to perform an operation on the one or more matrix operands;
a control unit;
local memory; and
a memory interface;
random access memory configured to have:
a first region configured to store the instructions and store matrices of an artificial neural network, the instructions executable by the at least one processing unit of the accelerator;
a second region configured to store inputs to the artificial neural network; and
a third region configured to store outputs generated by the accelerator autonomously executing the instructions to process, using the matrices stored in the first region, the inputs in the second region, wherein the control unit is configured to load, in response to the inputs being written into the second region, the instructions from the first region of the random access memory for execution by the at least one processing unit; and
at least two interfaces configured to access, via a connection between the memory interface of the accelerator and the random access memory, the random access memory concurrently by at least two devices that are external to the device, wherein the at least two interfaces include:
a first interface coupled to the third region and configured to provide a central processing unit configured outside of the integrated circuit package with access to obtain the outputs from the third region; and
a second interface coupled to the second region and configured to provide a direct memory access controller configured outside of the integrated circuit package with access to write the inputs into the second region.

2. The device of claim 1, wherein the first interface configured to be accessible by the central processing unit to retrieve a first output generated by the artificial neural network responsive to a first input, concurrent with a second input to the artificial neural network being written via the second interface into the second region.

3. The device of claim 2, wherein the third region includes a first portion of the random access memory having a first predetermined location configured to store a first indication which, when present, causes the accelerator to start an autonomous execution of the instructions in the first region; and wherein the second region includes a second portion of the random access memory having a second predetermined location configured to provide a second indication of progress of the autonomous execution.

4. The device of claim 3, wherein the first portion and the second portion are formed on separate integrated circuit dies; and
wherein the first interface and the second interface share no connections to the first portion and the second portion.

5. The device of claim 3, wherein the second indication is further configured to identify a location within the second region for the accelerator to retrieve an input for the autonomous execution.

6. The device of claim 3, wherein during the autonomous execution of the instructions by the accelerator in processing the second input using the random access memory, the first interface and the second interface have parallel access to the first portion and the second portion respectively.

7. The device of claim 3, wherein the first indication is further configured to identify a location within the third region for the accelerator to store an output resulting from the autonomous execution.

8. The device of claim 7, further comprising:
a first set of connectors coupled to the first interface to allow the central processing unit to access the third region; and
a second set of connectors coupled to the second interface to allow the direct memory access controller to access the second region concurrently with the central processing unit accessing the third region.

9. The device of claim 8, wherein the accelerator is configured on an integrated circuit die of a field-programmable gate array (FPGA) or application specific integrated circuit (ASIC) enclosed within the integrated circuit package.

10. The device of claim 9, wherein the at least one processing unit includes a matrix-matrix unit configured to operate on two matrix operands of an instruction;
wherein the matrix-matrix unit includes a plurality of matrix-vector units configured to operate in parallel;
wherein each of the plurality of matrix-vector units includes a plurality of vector-vector units configured to operate in parallel; and
wherein each of the plurality of vector-vector units includes a plurality of multiply-accumulate units configured to operate in parallel.

11. The device of claim 10, wherein the random access memory and the accelerator are formed on separate integrated circuit dies and connected by through-silicon vias (TSVs).

12. The device of claim 11, wherein the first region of the random access memory includes non-volatile memory configured to store the instructions and the matrices of the artificial neural network.

13. A method, comprising:
storing, in an integrated circuit device, matrices of an artificial neural network and instructions executable by an accelerator for deep learning, the accelerator having:
at least one processing unit enclosed within the integrated circuit device to implement the artificial neural network using the matrices;
a control unit
local memory; and
a memory interface, wherein the integrated circuit device has a random access memory and at least two interfaces configured to access, via a connection between the memory interface of the accelerator and the random access memory, the random access memory concurrently by at least two devices that are external to the integrated circuit device, wherein the at least two interfaces includes a first interface configured for a central processing unit that is outside of the integrated circuit device, and a second interface configured for a direct memory access controller that is outside of the integrated circuit device;

storing, into the random access memory enclosed within the integrated circuit device and via the second interface configured for the direct memory access controller, first input to the artificial neural network, wherein the random access memory configured have:
   a first region configured to store the instructions and the matrices of the artificial neural network;
   a second region configured to store the first inputs to the artificial neural network; and
   a third region configured to store first outputs generated by the accelerator autonomously executing the instructions to process, using the matrices stored in the first region, the first inputs in the second region;
loading, by the control unit, in response to the first inputs being written into the second region, the instructions from the first region of the random access memory for execution by the at least one processing unit
generating, from execution of the instructions, the first outputs in the third region; and
providing, through the first interface and to the central processing unit outside of the integrated circuit device, the first outputs from the random access memory in the integrated circuit device.

14. The method of claim 13, wherein the providing is in response to the central processing unit reading the random access memory through the second interface.

15. The method of claim 14, wherein the integrated circuit device is enclosed within an integrated circuit package; the at least one processing unit has at least a matrix-matrix unit configured to execute an instruction having two matrix operands; the matrix-matrix unit includes a plurality of matrix-vector units configured to operate in parallel; each of the matrix-vector units includes a plurality of vector-vector units configured to operate in parallel; and each of the vector-vector units includes a plurality of multiply-accumulate units configured to operate in parallel.

16. The method of claim 15, further comprising:
   converting a description of the artificial neural network into the instructions and the matrices.

17. The method of claim 16, wherein the providing of the first outputs through the first interface is performed in parallel with the direct memory access controller writing second inputs into the random access memory through the second interface.

18. An apparatus, comprising:
   random access memory having:
      a first region configured to store instructions and store matrices of an artificial neural network;
      a second region configured to store inputs to the artificial neural network; and
      a third region configured to store outputs generated by the artificial neural network responsive to the inputs;
   a field-programmable gate array (FPGA) or application specific integrated circuit (ASIC) comprising:
      a memory interface to access the random access memory;
      a control unit; and
      at least one processing unit configured to operate on two matrix operands of an instruction executed in the FPGA or ASIC, wherein the FPGA or ASIC is configured to autonomously execute the instructions stored in the first region to process, using the matrices stored in the first region, the inputs in the second region, wherein the control unit is configured to load, in response to the inputs being written into the second region, the instructions from the first region of the random access memory for execution by the FPGA or ASIC;
   a first interface configured for a memory controller of a central processing unit located outside of the apparatus to access the third region of the random access memory; and
   a second interface configured for a direct memory access controller located outside of the apparatus to access the second region of the random access memory;
   wherein the first interface and the second interface are configured to provide, to the central processing unit and the direct memory access controller, concurrent access to the random access memory; and
   wherein the control unit is configured to start autonomous execution of the instructions stored in the first region of the random access memory in response to an indication being written into a predetermined location of the random access memory, the indication including:
      an identification of a location in the random access memory where the FPGA or ASIC is to retrieve an input for the autonomous execution; and
      an identification of a location in the random access memory where the FPGA or ASIC is to store an output from the autonomous execution.

19. The apparatus of claim 18, wherein the random access memory includes non-volatile memory configured to store model data of the artificial neural network; the model data includes the instructions executable by the FPGA or ASIC; the central processing unit is configured to use the first interface to retrieve outputs from the artificial neural network; and the direct memory access controller is configured to use the second interface to provide inputs to the artificial neural network.

* * * * *